United States Patent
Ma et al.

(10) Patent No.: US 10,242,659 B2
(45) Date of Patent: *Mar. 26, 2019

(54) COMBINED ACTIVE NOISE CANCELLATION AND NOISE COMPENSATION IN HEADPHONE

(71) Applicant: Dolby Laboratories Licensing Corporation, San Francisco, CA (US)

(72) Inventors: Guilin Ma, Beijing (CN); Xiguang Zheng, Beijing (CN)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/878,145

(22) Filed: Jan. 23, 2018

(65) Prior Publication Data

US 2018/0151170 A1 May 31, 2018

Related U.S. Application Data

(63) Continuation of application No. 15/515,552, filed as application No. PCT/US2015/053176 on Sep. 30, 2015, now Pat. No. 9,911,404.

(30) Foreign Application Priority Data

Sep. 30, 2014 (CN) .......................... 2014 1 0521327

(51) Int. Cl.
*H04R 1/10* (2006.01)
*G10K 11/178* (2006.01)
(Continued)

(52) U.S. Cl.
CPC ...... *G10K 11/178* (2013.01); *G10K 11/17827* (2018.01); *G10K 11/17861* (2018.01);
(Continued)

(58) Field of Classification Search
CPC ......... G10K 11/178; G10K 2210/1081; G10K 2210/3055; G10K 2210/30232; H04R 1/10; H04R 1/1083; H03G 3/32; H03G 5/165
(Continued)

(56) References Cited

U.S. PATENT DOCUMENTS

| 6,118,878 A | 9/2000 | Jones |
| 7,050,966 B2 | 5/2006 | Schneider |

(Continued)

FOREIGN PATENT DOCUMENTS

| WO | 2009/134107 | 11/2009 |
| WO | 2012/138435 | 10/2012 |
| WO | 2013/144099 | 10/2013 |

*Primary Examiner* — Melur Ramakrishnaiah

(57) ABSTRACT

The disclosure relates to combined active noise cancellation and noise compensation in a headphone. An audio processing device includes a selector and a noise compensation unit. The selector can select one of a plurality of first transfer functions based on at least one feature of at least one of an external noise and a content audio signal representing a sound to be reproduced through the headphone. The noise compensation unit can compute a second audio signal by applying the selected first transfer function to a first audio signal, and derive gains for the noise compensation at least based on the second audio signal. The at least one feature can be used to distinguish at least two of the first transfer functions. Each of the first transfer functions can transform the first audio signal to the second audio signal which is assumed as representing a version of the sound represented by the first audio signal, which arrives at an eardrum of a listener wearing the headphone. The first audio signal is one of a noise signal representing the external noise and the content audio signal.

5 Claims, 5 Drawing Sheets

Related U.S. Application Data

(60) Provisional application No. 62/074,881, filed on Nov. 4, 2014.

(51) Int. Cl.
*H03G 5/16* (2006.01)
*H03G 3/32* (2006.01)

(52) U.S. Cl.
CPC ......... *G10K 11/17873* (2018.01); *H03G 3/32* (2013.01); *H03G 5/165* (2013.01); *H04R 1/1083* (2013.01); *G10K 2210/1081* (2013.01); *G10K 2210/3025* (2013.01); *G10K 2210/3055* (2013.01); *G10K 2210/30232* (2013.01); *G10K 2210/3224* (2013.01)

(58) Field of Classification Search
USPC .............................. 381/94.8, 94.1, 71.1, 74
See application file for complete search history.

(56) References Cited

U.S. PATENT DOCUMENTS

| | | | |
|---|---|---|---|
| 8,054,992 | B2 | 11/2011 | Sapiejewski |
| 8,280,065 | B2 | 10/2012 | Nadjar |
| 8,345,888 | B2 | 1/2013 | Carreras |
| 2008/0112569 | A1 | 5/2008 | Asada |
| 2009/0323976 | A1* | 12/2009 | Asada ............... G10K 11/178 381/71.1 |
| 2010/0296668 | A1 | 11/2010 | Lee |
| 2011/0251704 | A1 | 10/2011 | Walsh |
| 2011/0286606 | A1 | 11/2011 | Al-Naimi |
| 2012/0063611 | A1 | 3/2012 | Kimura |
| 2012/0215519 | A1 | 8/2012 | Park |
| 2013/0156213 | A1* | 6/2013 | Pan ..................... H04R 29/00 381/71.4 |
| 2015/0195646 | A1 | 7/2015 | Kumar |

\* cited by examiner

COMBINED ACTIVE NOISE CANCELLATION AND NOISE COMPENSATION IN HEADPHONE

CROSS-REFERENCE TO RELATED APPLICATIONS

This application is a continuation of U.S. patent application Ser. No. 15/515,552, filed Mar. 29, 2017, which is the national stage entry for PCT Application No. PCT/US2015/053176, filed Sep. 30, 2015, which claims priority to both Chinese Patent Application No. 201410521327.3, filed Sep. 30, 2014, and U.S. Provisional Patent Application No. 62/074,881, filed Nov. 4, 2014, all of which are hereby incorporated in their entirety by reference.

TECHNICAL FIELD

The example embodiments disclosed herein relates generally to joint active noise cancellation and noise compensation in headphone. More specifically, the example embodiments relate to headphones with audio enhancement in combined active noise cancellation and noise compensation.

BACKGROUND

Techniques of active noise cancellation and noise compensation have been proposed to improve headphone playback quality in the presence of external interferences. Approaches of combining the noise compensation and the active noise cancellation have been proposed to benefit from both of them, for example, in WO2013144099A1, "Apparatus and Method for Improving the Perceived Quality of Sound Reproduction by Combining Active Noise Cancellation and Perceptual Noise compensation," the contents of which are incorporated by reference herein in their entirety.

FIG. 1 is a block diagram illustrating an example of an audio processing device 100 for performing combined active noise cancellation and noise compensation in a headphone. As illustrated in FIG. 1, the audio processing device 100 includes a noise compensation unit 101, an active noise cancellation unit 102 and a combiner 103.

The noise compensation unit 101 aims to enhance the headphone playback quality by boosting an audio signal (also called content audio signal) to be played by the headphone. Specifically, the noise compensation unit 101 is configured to obtain the spectral characteristics of a noise signal captured from the external noise and selectively adjust the playback level of the audio signal by deriving one or more gains in response. In determining the gains, in spectral regions in which the background noise is not deemed as distracting, the audio signal is left largely unmodified. However, in spectral regions in which the background noise level is high enough to negatively affect the perceived quality or audibility of the audio signal, a level adjustment is made to the audio signal to improve the audio quality for the listener.

The active noise cancellation unit 102 aims to enhance the headphone playback quality by reducing the noise level arriving at the listeners' eardrum. That is, it tries to generate a signal that has the inverse phase with the residual noise, that is, external noise leaked through the headphone, and thus reduce the amount of noise arriving at the eardrum. In summary, it targets to enhance the audio quality by attenuating the level of the undesired external noise. It should be noted that the effectiveness of the noise cancellation technique is limited below (around) 1500 Hz. Cancellation of the higher frequency noise is constrained by hardware limitations.

The combiner 103 combines the audio signal adjusted by the noise compensation unit 101 and the signal generated by the active noise cancellation unit 102 and outputs a combined audio signal so as to reproduce it through a speaker 104 of the headphone. Alternatively, the combiner 103 may be incorporated in the active noise cancellation unit 102. In this situation, the active noise cancellation unit 102 may give boost to the audio signal played by the headphone to further enhance the signal to noise ratio.

SUMMARY

According to an example embodiment, there is provided an audio processing device for performing combined active noise cancellation and noise compensation in a headphone. The audio processing device includes a selector and a noise compensation unit. The selector can select one of a plurality of first transfer functions based on at least one feature of at least one of an external noise and a content audio signal representing a sound to be reproduced through the headphone. The noise compensation unit can compute a second audio signal by applying the selected first transfer function to a first audio signal, and derive gains for the noise compensation at least based on the second audio signal. The at least one feature can be used to distinguish at least two of the first transfer functions. Each of the first transfer functions can transform the first audio signal to the second audio signal which is assumed as representing a version of the sound represented by the first audio signal, which arrives at an eardrum of a listener wearing the headphone. The first audio signal is one of a noise signal representing the external noise and the content audio signal.

According to an example embodiment, there is provided a signal processing method of performing combined active noise cancellation and noise compensation in a headphone. According to the method, one of a plurality of first transfer functions is selected based on at least one feature of at least one of an external noise and a content audio signal representing a sound to be reproduced through the headphone. A second audio signal is computed by applying the selected first transfer function to a first audio signal. Gains for the noise compensation are derived at least based on the second audio signal. The at least one feature can be used to distinguish at least two of the first transfer functions. Each of the first transfer functions can transform the first audio signal to the second audio signal which is assumed as representing a version of the sound represented by the first audio signal, which arrives at an eardrum of a listener wearing the headphone. The first audio signal is one of a noise signal representing the external noise and the content audio signal.

According to an example embodiment, there is provided a headphone. The headphone includes one audio processing device as described in the above.

According to an example embodiment, there is provided a headphone. The headphone includes a first audio processing device and a second audio processing device as described in the above. The first audio processing device is associated with one ear cup of the headphone, and the second audio processing device is associated with another ear cup of the headphone.

Further features and advantages of the example embodiments, as well as the structure and operation of various embodiments, are described in detail below with reference to the accompanying drawings. It is noted that an example embodiment are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF DRAWINGS

The example embodiments are illustrated by way of example, and not by way of limitation, in the figures of the accompanying drawings and in which like reference numerals refer to similar elements and in which.

DETAILED DESCRIPTION

Figure 1:
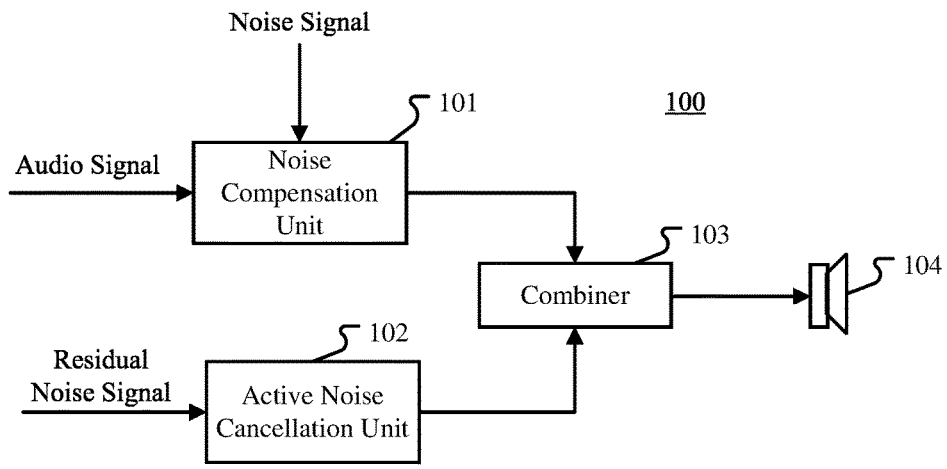
FIG. 1 is a block diagram illustrating an example of an audio processing device for performing combined active noise cancellation and noise compensation in a headphone.

The example embodiments are below described by referring to the drawings. It is to be noted that, for purpose of clarity, representations and descriptions about those components and processes known by those skilled in the art but unrelated to the example embodiment are omitted in the drawings and the description.

As will be appreciated by one skilled in the art, aspects of the example embodiment may be embodied as a system, method or computer program product. Accordingly, aspects of the example embodiment may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the example embodiment may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof.

A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wired line, optical fiber cable, RF, etc., or any suitable combination of the foregoing.

Computer program code for carrying out operations for aspects of the example embodiments may be written in any combination of one or more programming languages, including an object oriented programming language such as Java, Smalltalk, C++ or the like and conventional procedural programming languages, such as the "C" programming language or similar programming languages.

Aspects of the example embodiments are described below with reference to flowchart illustrations and/or block diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Noise compensation algorithms aim to improve perceived quality or audibility of content audio signals. In executing the noise compensation, the perceived quality or audibility is evaluated based on estimated noise and sound reproduced from (also called represented by) the content audio signal arriving at eardrums of a listener wearing a headphone. The external noise is usually represented by a noise signal captured from environment. Noise or sound arriving at the eardrum is usually represented by an audio signal which is assumed as being captured therefrom at the position of the eardrum (called estimated noise or audio signal respectively). In scenarios of combined active noise cancellation and noise compensation, those skilled in the art will appreciate that a path for transferring the external noise to an eardrum of the listener can have difference responses in case of different levels of the external noise, different levels of the content audio signal, or different directivities of the external noise. Those skilled in the art will also appreciate that a path for transforming a content audio signal to a sound arriving at an eardrum of the listener can have different responses in the case of different levels of the external noise, or different levels of the content audio signal. This means that the paths exhibit dependencies on some features of the external noise or the content audio signal. Consideration of these dependencies in the noise compensation algorithms can be helpful to improve accuracy of estimation on signals arriving at the eardrum, and thus, to improve the perceived quality or audibility.

Figure 2:
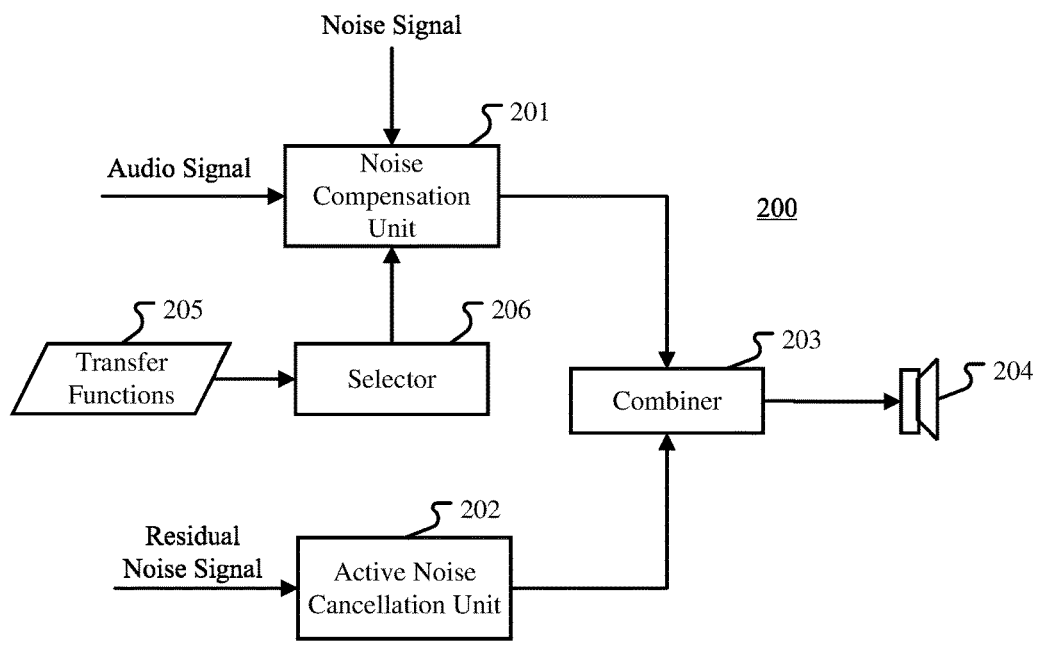
FIG. 2 is a block diagram illustrating an audio processing device for performing combined active noise cancellation and noise compensation in a headphone according to an embodiment.

FIG. 2 is a block diagram illustrating an audio processing device 200 for performing combined active noise cancellation and noise compensation in a headphone according to an example embodiment.

As illustrated in FIG. 2, the audio processing device 200 includes a noise compensation unit 201, an active noise cancellation unit 202, a combiner 203, and a selector 206. The active noise cancellation unit 202 and the combiner 203 have the same functions as the active noise cancellation unit 102 and the combiner 103 respectively, and will not be described in detail herein.

The selector 206 is incorporated to deal with at least one of combinations of the dependencies and the paths.

The dependencies are caused mainly by two factors. One factor is the feature of the external noise and the content audio signal which can affect the processing of the active noise cancellation and the noise compensation, and thus affect the sound arriving at the eardrum. That is to say, the active noise cancellation algorithm and/or the noise compensation algorithm perform the processing in a non-linear manner over different values of the feature. Examples of the feature include but are not limited to signal level and signal power. It can be appreciated that any aspect of the external noise and the content audio signal which can affect the processing in a non-linear manner can function as one of such features. Another factor is the substantial difference between paths. For example, in case of a moving external noise source, the path is changing over time because the path at one time can be different from the path at another time. A similar situation may occur in case of a moving listener. Therefore, the directivity of the external noise relative to the eardrum of the listener can function as one of such features.

It can be appreciated that at least two different values of such a feature can indicate a difference in response of a path respectively under situations of these two different values of the feature, and therefore, such a feature can be used to distinguish the transfer functions of the path under situations of these two different values of feature.

Non-limiting examples of dependencies of paths on specific features are illustrated in the following table.

| Dependency | Feature | Path |
|---|---|---|
| 1 | Signal level or power of noise | Noise |
| 2 | Signal level or power of noise | Audio |
| 3 | Signal level or power of audio | Noise |
| 4 | Signal level or power of audio | Audio |
| 5 | Directivity of noise | Noise |
| 6 | Signal level or power of noise and audio | Noise |
| 7 | Signal level or power of noise and audio | Audio |
| 8 | Signal level or power of noise and Directivity of noise | Noise |

One specific dependency may be implemented as an association between transfer functions of a path and values of one or more features on which the path has the dependency upon. The value range of a feature may be divided into bins represented by discrete levels respectively, and feature values falling within a bin can be represented by the corresponding level. The ordering and specific listing/label of features are merely provided as a non-limiting example for illustration purposes of some of example embodiments.

The dependency may also be implemented by generating a combined transfer function with the value of the feature as an argument. The combined transfer function can apply a transfer function associated with the value of the feature. In the latter case, the function of the selector 206 is incorporated into the combined transfer function, and when the combined transfer function is applied, the function of the selector 206 works.

In the embodiment as illustrated in FIG. 2, as an example of dependency 1, each of transfer functions 205 is configured to transform a noise signal representing the external noise to an estimated noise signal which is assumed as representing the external noise arriving at an eardrum of a listener wearing the headphone. The selector 206 is configured to select a transfer function based on the level of the noise signal from transfer functions 205. The noise compensation unit 201 is configured to compute the estimated noise signal by applying the selected transfer function to the noise signal, and derive gains for the noise compensation at least based on the estimated noise signal.

As an example of dependency 2, each of transfer functions 205 is configured to transform a noise signal representing the external noise to an estimated noise signal which is assumed as representing the external noise arriving at an eardrum of a listener wearing the headphone. The selector 206 is configured to select a transfer function based on the level of a content audio signal representing a sound to be reproduced through the headphone from transfer functions 205. The noise compensation unit 201 is configured to compute the estimated noise signal by applying the selected transfer function to the noise signal, and derive gains for the noise compensation at least based on the estimated noise signal.

As an example of dependency 3, each of transfer functions 205 is configured to transform a content audio signal representing a sound to be reproduced through the headphone to an estimated audio signal which is assumed as representing the sound arriving at an eardrum of a listener wearing the headphone. The selector 206 is configured to select a transfer function based on the level of a noise signal representing the external noise from transfer functions 205. The noise compensation unit 201 is configured to compute an estimated audio signal by applying the selected transfer function to the content audio signal, and derive gains for the noise compensation at least based on the estimated audio signal.

As an example of dependency 4, each of transfer functions 205 is configured to transform a content audio signal representing a sound to be reproduced through the headphone to an estimated audio signal which is assumed as representing the sound arriving at an eardrum of a listener wearing the headphone. The selector 206 is configured to select a transfer function based on the level of the content audio signal from transfer functions 205. The noise compensation unit 201 is configured to compute an estimated audio signal by applying the selected transfer function to the content audio signal, and derive gains for the noise compensation at least based on the estimated audio signal.

As an example of dependency 6, each of transfer functions 205 is configured to transform a noise signal representing the external noise to an estimated noise signal which is assumed as representing the external noise arriving at an eardrum of a listener wearing the headphone. The selector 206 is configured to select a transfer function based on the level of the noise signal and the level of a content audio signal representing a sound to be reproduced through the headphone from transfer functions 205. The noise compensation unit 201 is configured to compute the estimated noise signal by applying the selected transfer function to the noise signal, and derive gains for the noise compensation at least based on the estimated noise signal.

As an example of dependency 7, each of transfer functions 205 is configured to transform a content audio signal representing a sound to be reproduced through the headphone to an estimated audio signal which is assumed as representing the sound arriving at an eardrum of a listener wearing the headphone. The selector 206 is configured to select a transfer function based on the level of a noise signal representing the external noise and the level of the content audio signal from transfer functions 205. The noise compensation unit 201 is configured to compute an estimated audio signal by applying the selected transfer function to the content audio signal, and derive gains for the noise compensation at least based on the estimated audio signal.

Figure 3:
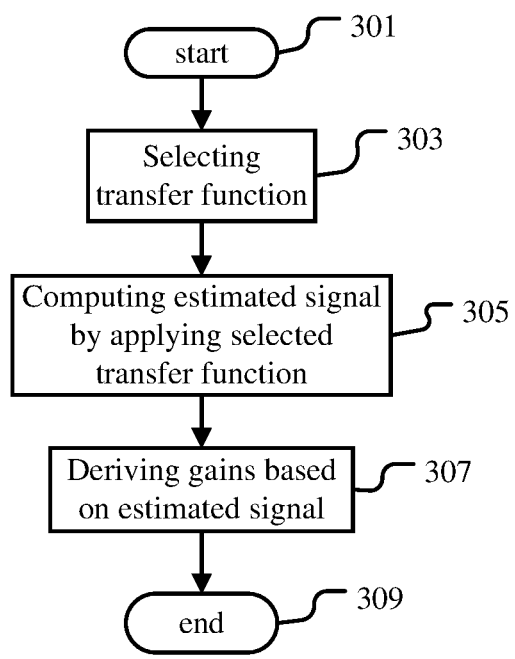
FIG. 3 is a flowchart illustrating signal processing method of performing combined active noise cancellation and noise compensation in a headphone according to an embodiment.

FIG. 3 is a flowchart illustrating signal processing method 300 of performing combined active noise cancellation and noise compensation in a headphone according to an example embodiment.

As illustrated in FIG. 3, the method 300 starts from step 301. At step 303, one of a plurality of transfer functions is selected based on at least one feature of an external noise, a content audio signal representing a sound to be reproduced through the headphone, or both the external noise and the content audio signal. The at least one feature can be used to distinguish at least two of the transfer functions. Each of the transfer functions is configured to transform a noise signal representing the external noise to an estimated noise signal representing the external noise arriving at an eardrum of a listener wearing the headphone, or to transform a content audio signal representing a sound to be reproduced through the headphone to an estimated audio signal representing the sound arriving at the eardrum.

At step 305, the estimated signal is computed by applying the selected transfer function to the noise signal or the content audio signal.

At step 307, gains for the noise compensation are derived at least based on the estimated signal. The method 300 ends at step 309.

Figure 4:
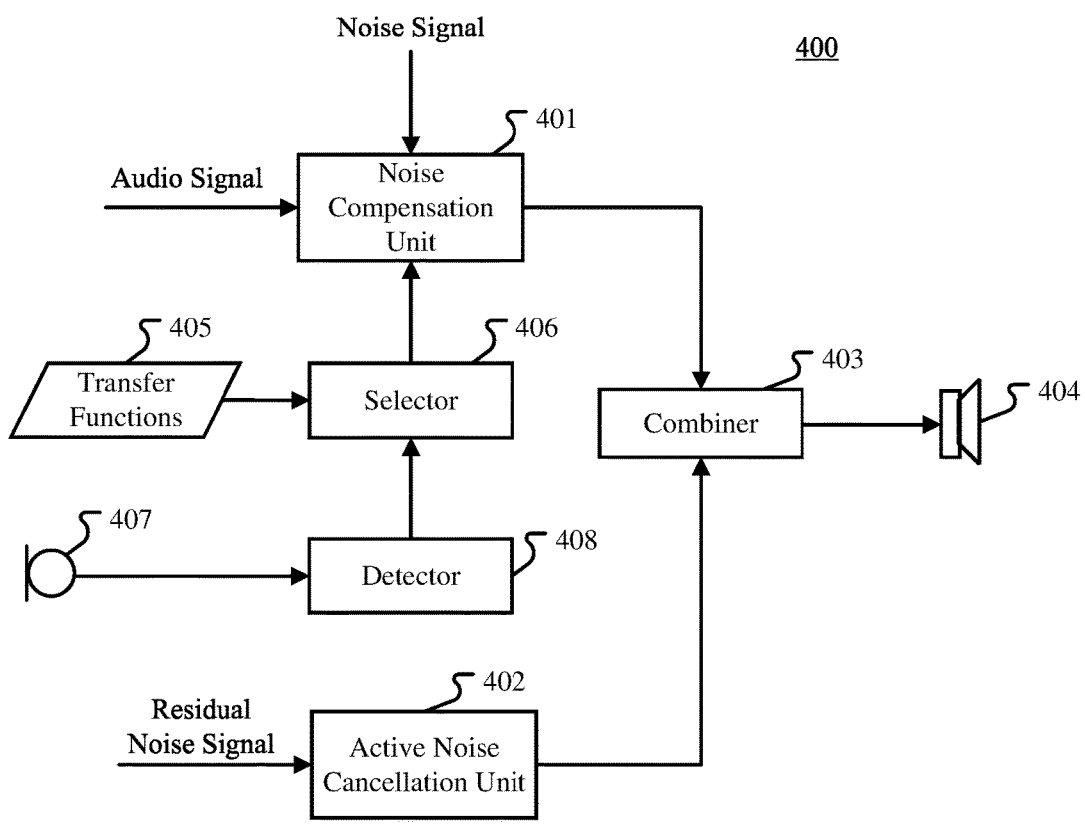
FIG. 4 is a block diagram illustrating an audio processing device for performing combined active noise cancellation and noise compensation in a headphone according to an embodiment.

FIG. 4 is a block diagram illustrating an audio processing device 400 for performing combined active noise cancellation and noise compensation in a headphone according to an embodiment.

As illustrated in FIG. 4, the audio processing device 400 includes a noise compensation unit 401, an active noise cancellation unit 402, a combiner 403, a selector 406, a microphone 407 and a detector 408. The noise compensation unit 401, the active noise cancellation unit 402 and the combiner 403 have the same functions as the noise compensation unit 201, the active noise cancellation unit 202 and the combiner 203 respectively, and will not be described in detail herein.

In the embodiment as illustrated in FIG. 4, as an example of dependency 5, each of transfer functions 405 is configured to transform a noise signal representing the external noise to an estimated noise signal which is assumed as representing the external noise arriving at an eardrum of a listener wearing the headphone. The selector 406 is configured to select a transfer function based on the directivity of the external noise relative to the ear cup facing the eardrum.

As an example of dependency 8, each of transfer functions 405 is configured to transform a noise signal representing the external noise to an estimated noise signal which is assumed as representing the external noise arriving at an eardrum of a listener wearing the headphone. The selector 406 is configured to select a transfer function based on the directivity of the external noise relative to the ear cup facing the eardrum and the level of the noise signal.

The microphone 407 is configured to record the external noise. The detector 408 is configured to detect the directivity based on the output of the microphone 407. To detect the directivity, various techniques for detecting the direction of arrival (DOA) of a sound source may be employed. DOA algorithms like Generalized Cross Correlation with Phase Transform (GCC-PHAT), Steered Response Power-Phase Transform (SRP-PHAT), Multiple Signal Classification (MUSIC), or any other suitable DOA estimation algorithms may be used.

Figure 5:
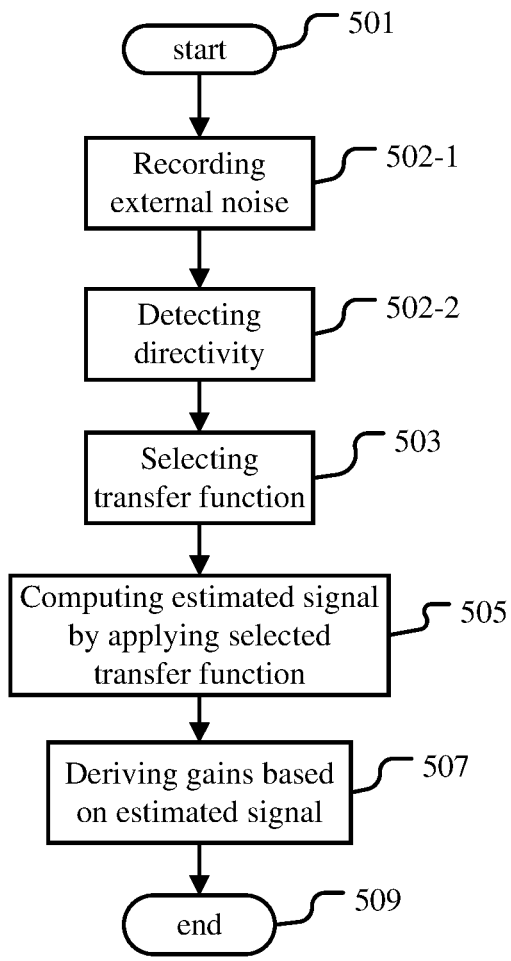
FIG. 5 is a flowchart illustrating signal processing method of performing combined active noise cancellation and noise compensation in a headphone according to an embodiment.

FIG. 5 is a flowchart illustrating signal processing method 500 of performing combined active noise cancellation and noise compensation in a headphone according to an example embodiment.

As illustrated in FIG. 5, the method 500 starts from step 501. At step 502-1, the external noise is recorded through at least one microphone. At step 502-2, the directivity of the external noise relative to the ear cup facing the eardrum is detected based on the output of the microphone. At step 503, one of a plurality of transfer functions is selected based on the directivity of the external noise and/or the level of the noise signal. Each of the transfer functions is configured to transform the noise signal to an estimated noise signal which is assumed as representing the external noise arriving at the eardrum. Steps 505 and 507 have the same functions as steps 305 and 307 respectively, and will not be described in detail herein. The method 500 ends at step 509.

In the embodiments described in connection with FIG. 2 and FIG. 4, dependencies are considered to compute the estimated noise signal or the estimated audio signal. In further modifications to these embodiments, dependencies may be considered to compute both the estimated noise signal and the estimated audio signal. The selector is configured to select a transfer function for transforming the noise signal to the estimated noise signal from the transfer functions based on at least one feature relating to the external noise and/or the content audio signal, and to select another transfer function for transforming the content audio signal to the estimated audio signal from the transfer functions based on at least one feature relating to the external noise and/or the content audio signal. The noise compensation unit is configured to compute the estimated noise signal by applying the selected transfer function to the noise signal, and to compute the estimated audio signal by applying the other selected transfer function to the content audio signal. The noise compensation unit is further configured to derive the gains based on the estimated noise signal and the estimated audio signal.

In the example embodiments described in connection with FIG. 3 and FIG. 5, dependencies are considered to compute the estimated noise signal or the estimated audio signal. In further modifications to these embodiments, dependencies may be considered to compute both the estimated noise signal and the estimated audio signal. The step of selecting may, for example include selecting a transfer function for transforming the noise signal to the estimated noise signal from the transfer functions based on at least one feature relating to the external noise and/or the content audio signal, and selecting another transfer function for transforming the content audio signal to the estimated audio signal from the transfer functions based on at least one feature relating to the external noise and/or the content audio signal. The step of computing may, for example include computing the estimated noise signal by applying the selected transfer function to the noise signal, and computing the estimated audio signal by applying the other selected transfer function to the content audio signal. The step of deriving may, for example include deriving the gains based on the estimated noise signal and the estimated audio signal.

In further modifications to the embodiments described in the above, there can be an enhanced mode where the function of selecting a transfer function and the functions relevant to the selecting, such as detecting, deriving and computing as described in connection with the embodiments are executed. The enhance mode can be entered in response to an enabling indication. For example, this enabling indication may be triggered through a user operation on a mode switch, in order to enable the enhanced mode for combined active noise cancellation and noise compensation. In another example, the enhanced mode can be the only mode for combined active noise cancellation and noise compensation by default, and once the feature of active noise cancellation and noise compensation is enabled, then the enhanced mode is enabled. The enabling indication may be implemented as a signal to receive, or a state or condition to check or detect.

Figure 6:
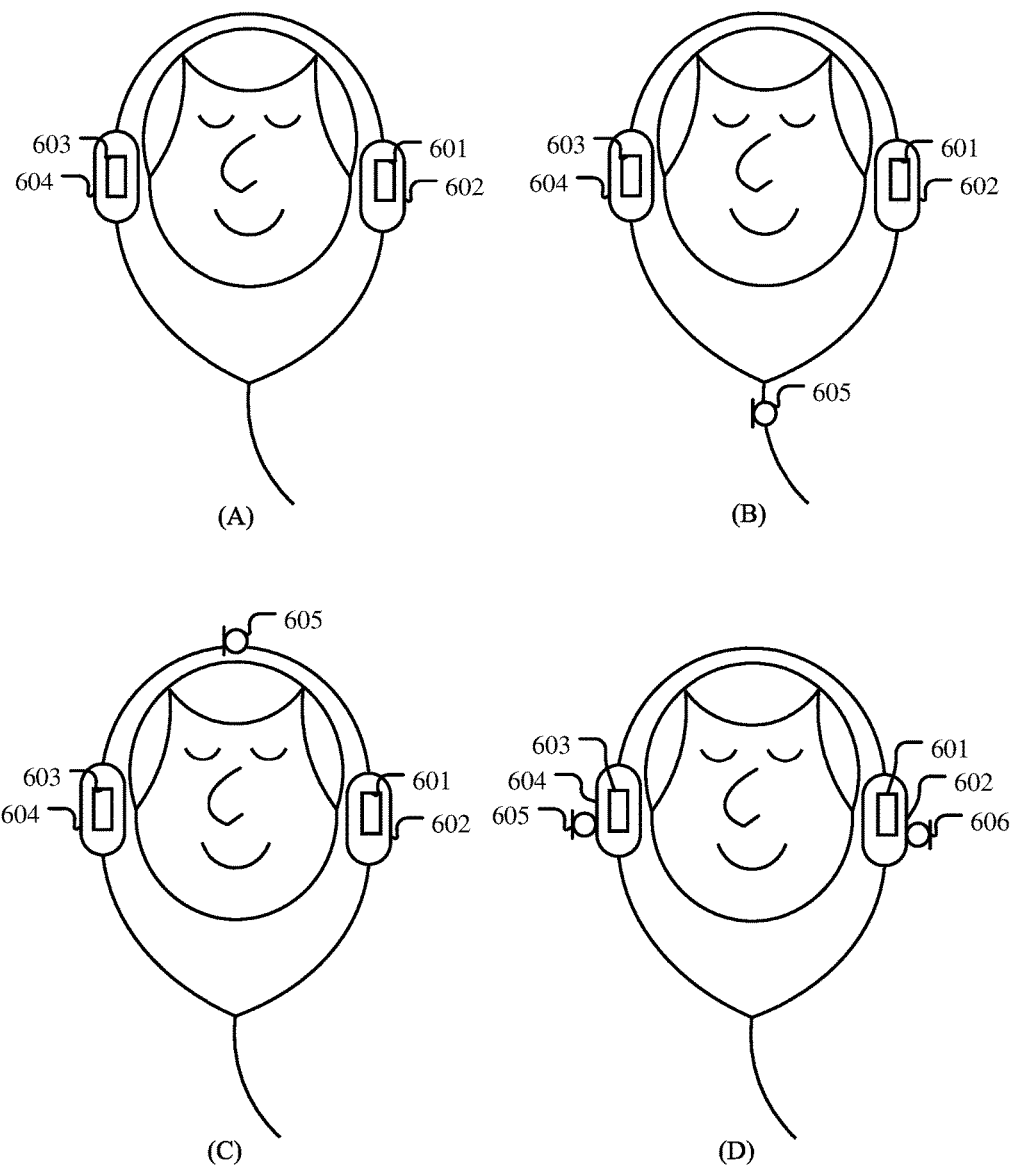
FIG. 6 is a schematic view illustrating non-limiting example configurations of a headphone with combined active noise cancellation and noise compensation according to an embodiment.

FIG. 6 is a schematic view illustrating non-limiting example configurations of a headphone with combined active noise cancellation and noise compensation according to an example embodiment.

FIG. 6 illustrates a headphone in portion (A). The headphone includes a left-side audio processing device 603 and a right-side audio processing device 601 according to the example embodiments described in the above. The audio processing device 601 is associated with a right-side ear cup 602, and the left-side audio processing device 603 is associated with left-side ear cup 604. Although the headphone is illustrated as receiving audio signals via a cable, it is also possible to receive audio signals via wireless connections such as Bluetooth and WiFi.

The transfer functions may be measured in advance with respect to the headphone of a specific configuration. The measured transfer functions can be deployed into headphones of the same configuration. The configuration comprises the position relation of a microphone for capturing the noise signal for the purpose of noise compensation relative to the corresponding eardrum or ear cup. It is preferred to keep this position relation stable or substantially fixed from measurement to actual usage, so as to facilitate improving the accuracy of estimation.

FIG. 6 illustrates several non-limiting example arrangements of the microphone described in portions (B), (C) and (D).

According to the arrangement illustrated in portion (B), a microphone 605 is, for example an inline microphone and is arranged near the joint of three cables. It is easy to keep this position stable and consistent in actual usage and measurement.

According to the arrangement illustrated in portion (C), a microphone 605 is for example, coupled, attached to or embedded in the belt connecting the left-side/right-side ear cups 604 and 602. It is easy to keep this position stable and consistent in actual usage and measurement.

According to the arrangement illustrated in portion (D), microphones 605 and 606 are coupled, attached to or embedded in the left-side/right-side ear cups 604 and 602 respectively, and are associated with the left-side/right-side audio processing devices 603 and 601 respectively. It is easy to keep this position stable and consistent in actual usage and measurement.

The transfer functions can be measured according to the following scheme. It is assumed that the transfer functions simulate an audio path or a noise path and are dependent on features. In the measurement, for each combination of levels of the features, at least one response of the path is measured, and then a transfer function can be derived based on the response. Under the requirement of keeping the combination unchanged, the response of the path may be measured under various signal conditions. For example, if the transfer functions simulate a noise path and the features include the level of noise signal, the signal condition for measurement cannot change because the level of noise signal is fixed. However, if the transfer functions simulate a noise path and the feature is the level of audio signal, for example, it is possible to change the level of noise signal and measure the response under various noise signal conditions.

Alternatively, a transfer function for simulating the noise path may include a first portion for simulating a path for transferring the external noise represented by the noise signal to the eardrum with the active noise cancellation being disabled, and a second portion for simulating a change caused by the active noise cancellation to the path. The first portion is measured under the condition of disabling the active noise cancellation. The second portion may be measured by comparing the measurement result under the condition of disabling the active noise cancellation and the measurement result under the condition of enabling the active noise cancellation.

Alternatively, a transfer function for simulating the audio path may include a first portion for simulating a path for converting the content audio signal to the version of the sound represented by the content audio signal, which arrives at the eardrum, with the active noise cancellation being disabled, and a second portion for simulating a change caused by the active noise cancellation to the path. The first portion is measured under the condition of disabling the active noise cancellation. The second portion may be measured by comparing the measurement result under the condition of disabling the active noise cancellation and the measurement result under the condition of enabling the active noise cancellation.

The terminology used herein is for the purpose of describing particular embodiments only and is not intended to be limiting of the example embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the example embodiments has been presented for purposes of illustration and description, but is not intended to be exhaustive or limited to the example embodiments in the form disclosed. Many modifications and variations will be apparent to those of ordinary skill in the art without departing from the scope and spirit of the example embodiments. The embodiment was chosen and described in order to best explain the principles of the example embodiments and the practical application, and to enable others of ordinary skill in the art to understand the example embodiments for various embodiments with various modifications as are suited to the particular use contemplated.

The following example embodiments (each referred to as an "EE") are described.

EE1. An audio processing device for performing combined active noise cancellation and noise compensation in a headphone, comprising:
 a selector configured to select one of a plurality of first transfer functions based on at least one feature of at least one of an external noise and a content audio signal representing a sound to be reproduced through the headphone; and
 a noise compensation unit configured to
 compute a second audio signal by applying the selected first transfer function to a first audio signal; and
 derive gains for the noise compensation at least based on the second audio signal, and
  wherein the at least one feature can be used to distinguish at least two of the first transfer functions, each of the first transfer functions is configured to transform the first audio signal to the second audio signal which is assumed as representing a version of the sound represented by the first audio signal, which arrives at an eardrum of a listener wearing the headphone, and the first audio signal is one of a noise signal representing the external noise and the content audio signal.

EE2. The audio processing device according to EE 1, wherein the at least one feature comprises at least one of the directivity of the external noise relative to the ear cup facing the eardrum in case that the first audio signal is the noise signal, the level of the noise signal and the level of the content audio signal, and
  wherein in case that the at least one feature comprises the directivity, the audio processing device further comprises:
 at least one microphone configured to record the external noise; and
 a detector configured to detect the directivity based on the output of the microphone.

EE3. The audio processing device according to one of EEs 1 to 2, wherein the first audio signal is the noise signal, and each of the first transfer functions includes a first portion for simulating a path for transferring the external noise represented by the noise signal to the eardrum with the active noise cancellation being disabled, and a second portion for simulating a change caused by the active noise cancellation to the path.

EE4. The audio processing device according to one of EEs 1 to 2, wherein the first audio signal is the content audio signal, and each of the first transfer functions includes a first portion for simulating a path for converting the content audio signal to the version of the sound represented by the content audio signal, which arrives at the eardrum, with the active noise cancellation being disabled, and a second portion for simulating a change caused by the active noise cancellation to the path.

EE5. The audio processing device according to EE 1, wherein the selector is further configured to select one of a plurality of second transfer functions based on at least one feature of at least one of the external noise and the content audio signal,
  wherein the noise compensation unit is further configured to
 compute a fourth audio signal by applying the selected second transfer function to a third audio signal,
  wherein the deriving of the gains comprises deriving the gains based on the second audio signal and the fourth audio signal, and
  wherein the at least one feature for selecting the second transfer function can be used to distinguish at least two of the second transfer functions, each of the second transfer functions is configured to transform the third audio signal to the fourth audio signal which is assumed as representing a version of the sound represented by the third audio signal, which arrives at the eardrum, wherein the third audio signal is one of the noise signal and the content audio signal, and the third audio signal is different from the first audio signal.

EE6. The audio processing device according to EE 5, wherein the at least one feature for selecting the second transfer function comprises at least one of the directivity of the external noise relative to the ear cup facing the eardrum in case that the third audio signal is the noise signal, the level of the noise signal and the level of the content audio signal, and
  wherein in case that the at least one feature for selecting the second transfer function comprises the directivity, the audio processing device further comprises:
 at least one microphone configured to record the external noise; and
 a detector configured to detect the directivity based on the output of the microphone.

EE7. The audio processing device according to one of EEs 5 to 6, wherein the first audio signal is the noise signal, and each of the first transfer functions includes a first portion for simulating a first path for transferring the external noise represented by the noise signal to the eardrum with the active noise cancellation being disabled, and a second portion for simulating a change caused by the active noise cancellation to the first path, and
  wherein each of the second transfer functions includes a third portion for simulating a second path for converting the content audio signal to the version of the sound represented by the content audio signal, which arrives at the eardrum, with the active noise cancellation being disabled, and a fourth portion for simulating a change caused by the active noise cancellation to the second path.

EE8. The audio processing device according to one of EEs 1 to 7, wherein the selector is further configured to execute the operation of selecting in response to an enabling indication, and the noise compensation unit is further configured to execute the operations of computing and deriving in response to an enabling indication.

EE9. A signal processing method of performing combined active noise cancellation and noise compensation in a headphone, comprising:
  selecting one of a plurality of first transfer functions based on at least one feature of at least one of an external noise and a content audio signal representing a sound to be reproduced through the headphone;
  computing a second audio signal by applying the selected first transfer function to a first audio signal; and
  deriving gains for the noise compensation at least based on the second audio signal, and
  wherein the at least one feature can be used to distinguish at least two of the first transfer functions, each of the first transfer functions is configured to transform the first audio signal to the second audio signal which is assumed as representing a version of the sound represented by the first audio signal, which arrives at an eardrum of a listener wearing the headphone, and the first audio signal is one of a noise signal representing the external noise and the content audio signal.

EE10. The signal processing method according to EE 9, wherein the at least one feature comprises at least one of the directivity of the external noise relative to the ear cup facing the eardrum in case that the first audio signal is the noise signal, the level of the noise signal and the level of the content audio signal, and
  wherein in case that the at least one feature comprises the directivity, the method further comprises:
  recording the external noise through at least one microphone; and
  detecting the directivity based on the output of the microphone.

EE11. The signal processing method according to one of EEs 9 to 10, wherein the first audio signal is the noise signal, and each of the first transfer functions includes a first portion for simulating a path for transferring the external noise represented by the noise signal to the eardrum with the active noise cancellation being disabled, and a second portion for simulating a change caused by the active noise cancellation to the path.

EE12. The signal processing method according to one of EEs 9 to 10, wherein the first audio signal is the content audio signal, and each of the first transfer functions includes a first portion for simulating a path for converting the content audio signal to the version of the sound represented by the content audio signal, which arrives at the eardrum, with the active noise cancellation being disabled, and a second portion for simulating a change caused by the active noise cancellation to the path.

EE13. The signal processing method according to EE 9, further comprising:
  selecting one of a plurality of second transfer functions based on at least one feature of at least one of the external noise and the content audio signal; and
  computing a fourth audio signal by applying the selected second transfer function to a third audio signal,
  wherein the deriving of the gains comprises deriving the gains based on the second audio signal and the fourth audio signal, and
  wherein the at least one feature for selecting the second transfer function can be used to distinguish at least two of the second transfer functions, each of the second transfer functions is configured to transform the third audio signal to the fourth audio signal which is assumed as representing a version of the sound represented by the third audio signal, which arrives at the eardrum, wherein the third audio signal is one of the noise signal and the content audio signal, and the third audio signal is different from the first audio signal.

EE14. The signal processing method according to EE 13, wherein the at least one feature for selecting the second transfer function comprises at least one of the directivity of the external noise relative to the ear cup facing the eardrum in case that the third audio signal is the noise signal, the level of the noise signal and the level of the content audio signal, and
  wherein in case that the at least one feature for selecting the second transfer function comprises the directivity, the method further comprises:
  recording the external noise through at least one microphone; and
  detecting the directivity based on the output of the microphone.

EE15. The signal processing method according to one of EEs 13 to 14, wherein the first audio signal is the noise signal, and each of the first transfer functions includes a first portion for simulating a first path for transferring the external noise represented by the noise signal to the eardrum with the active noise cancellation being disabled, and a second portion for simulating a change caused by the active noise cancellation to the first path, and
  wherein each of the second transfer functions includes a third portion for simulating a second path for converting the content audio signal to the version of the sound represented by the content audio signal, which arrives at the eardrum, with the active noise cancellation being disabled, and a fourth portion for simulating a change caused by the active noise cancellation to the second path.

EE16. The signal processing method according to one of EEs 9 to 15, wherein the steps of selecting, computing and deriving are executed in response to an enabling indication.

EE17. A headphone comprising:
  a first audio processing device according to one of EEs 1-7, which is associated with one ear cup of the headphone; and
  a second audio processing device according to one of EEs 1-7, which is associated with another ear cup of the headphone.

EE18. The headphone according to EE 17, further comprising:
  a microphone configured to capture the noise signal, and adapted to be arranged at a fixed location relative to the ear cups.

We claim:

1. A computer program product, comprising a computer program tangibly embodied on a machine medium, the computer program containing program code for performing combined active noise cancellation and noise compensation in a headphone, comprising:
  selecting one of a plurality of first transfer functions based on at least one feature of at least one of an external noise and a content audio signal representing a sound to be reproduced through the headphone; and
  preforming noise compensation by computing a second audio signal by applying the selected first transfer function to a first audio signal; and
  deriving gains for the noise compensation at least based on the second audio signal, and
  wherein the at least one feature can be used to distinguish at least two of the first transfer functions, each of the first transfer functions is configured to transform the first audio signal to the second audio signal which is assumed as representing a version of the sound represented by the first audio signal, which arrives at an eardrum of a listener wearing the headphone, and the first audio signal is the content audio signal.

2. The computer program product, according to claim 1, wherein the at least one feature comprises at least one of the level of the noise signal and the level of the content audio signal.

3. The computer program product, according to claim 1, wherein each of the first transfer functions includes a first portion for simulating a path for converting the content audio signal to the version of the sound represented by the content audio signal, which arrives at the eardrum, with the active noise cancellation being disabled, and a second portion for simulating a change caused by the active noise cancellation to the path.

4. The computer program product, according to claim 1, further comprising,
   selecting one of a plurality of second transfer functions based on at least one feature of at least one of the external noise and the content audio signal,
   preforming noise compensation by computing a fourth audio signal by applying the selected second transfer function to a third audio signal,
   wherein the deriving of the gains comprises deriving the gains based on the second audio signal and the fourth audio signal, and
   wherein the at least one feature for selecting the second transfer function can be used to distinguish at least two of the second transfer functions, each of the second transfer functions is configured to transform the third audio signal to the fourth audio signal which is assumed as representing a version of the sound represented by the third audio signal, which arrives at the eardrum, wherein the third audio signal is the noise signal.

5. The computer program product, according to claim 1, wherein the at least one feature for selecting the second transfer function comprises at least one of the directivity of the external noise relative to the ear cup facing the eardrum, the level of the noise signal and the level of the content audio signal, and
   wherein in case that the at least one feature for selecting the second transfer function comprises the directivity, the audio processing device further comprises:
   at least one microphone configured to record the external noise; and a detector configured to detect the directivity based on the output of the microphone.

* * * * *